United States Patent
Liu et al.

(10) Patent No.: US 11,450,732 B2
(45) Date of Patent: Sep. 20, 2022

(54) STRUCTURE FOR CAPACITOR PROTECTION, PACKAGE STRUCTURE, AND METHOD OF FORMING PACKAGE STRUCTURE

(71) Applicant: SUZHOU TF-AMD SEMICONDUCTOR CO. LTD., Suzhou (CN)

(72) Inventors: Zhe Liu, Suzhou (CN); Borrong Huang, Suzhou (CN); Hongjie Wang, Suzhou (CN); Diong Hing Ding, Suzhou (CN)

(73) Assignee: SUZHOU TF-AMD SEMICONDUCTOR CO. LTD., Suzhou (CN)

( * ) Notice: Subject to any disclaimer, the term of this patent is extended or adjusted under 35 U.S.C. 154(b) by 20 days.

(21) Appl. No.: 16/809,580

(22) Filed: Mar. 5, 2020

(65) Prior Publication Data
US 2020/0286983 A1 Sep. 10, 2020

(30) Foreign Application Priority Data
Mar. 8, 2019 (CN) .......................... 201910174141.8

(51) Int. Cl.
*H01L 21/48* (2006.01)
*H01L 21/50* (2006.01)
(Continued)

(52) U.S. Cl.
CPC .......... *H01L 28/40* (2013.01); *H01L 21/4871* (2013.01); *H01L 21/50* (2013.01);
(Continued)

(58) Field of Classification Search
CPC ..... H01L 28/40; H01L 21/4871; H01L 21/50; H01L 23/3672; H01L 23/3737;
(Continued)

(56) References Cited

U.S. PATENT DOCUMENTS 5,471,027 A * 11/1995 Call ...................... H01L 21/563
219/85.13
6,313,521 B1 * 11/2001 Baba ..................... H01L 21/563
257/659
(Continued)

FOREIGN PATENT DOCUMENTS

CN 101226927 A 7/2008
CN 108550558 A 9/2016
(Continued)

OTHER PUBLICATIONS

Chinese First office actiont,Chinese Application No. 201910174141. 8, dated Apr. 27, 2020 (20 pages).
(Continued)

*Primary Examiner* — Duy T Nguyen

(57) ABSTRACT

A package structure includes: a substrate; a chip arranged on a part of a surface of the substrate; a metal thermal conducting layer arranged on a top surface of the chip; a capacitive structure arranged on another part of the surface of the substrate and arranged to be independent from the chip; and a cover including a first cover layer and a second cover layer connected to the first cover layer. A first opening is defined to extend through the first and the second cover layers. The second cover layer is arranged on a bottom of the first cover layer and perpendicular to the first cover layer. The first cover layer is arranged on the capacitive structure. The chip is received in the first opening. The second cover layer is arranged between the capacitive structure and the chip, and is fixed to the substrate.

20 Claims, 7 Drawing Sheets

(51) Int. Cl.
*H01L 23/367* (2006.01)
*H01L 23/373* (2006.01)
*H01L 23/64* (2006.01)
*H01L 21/60* (2006.01)
*H01L 49/02* (2006.01)

(52) U.S. Cl.
CPC ...... *H01L 23/3672* (2013.01); *H01L 23/3737* (2013.01); *H01L 23/642* (2013.01); *H01L 2021/60135* (2013.01)

(58) Field of Classification Search
CPC ......... H01L 23/642; H01L 2021/60135; H01L 2224/05644; H01L 23/3675; H01L 23/49822; H01L 24/32; H01L 2224/29109; H01L 2224/29111; H01L 2224/29139; H01L 2224/32245; H01L 2224/83444; H01L 2224/83815; H01L 2924/16251; H01L 23/42; H01L 23/50; H01L 25/165; H01L 2224/16227; H01L 2224/32225; H01L 2224/33181; H01L 2224/73204; H01L 2224/73253; H01L 2924/16235; H01L 2924/19106
USPC .......................................................... 257/532
See application file for complete search history.

(56) References Cited

U.S. PATENT DOCUMENTS

| | | | |
|---|---|---|---|
| 7,242,081 B1* | 7/2007 | Lee | H01L 25/0657 257/E25.023 |
| 8,901,732 B2 | 12/2014 | Yew et al. | |
| 8,922,511 B1* | 12/2014 | Salmon | G06F 1/1643 345/173 |
| 2005/0056926 A1* | 3/2005 | Chen | H01L 23/10 257/706 |
| 2009/0057884 A1* | 3/2009 | Too | H01L 23/04 257/723 |
| 2009/0200659 A1* | 8/2009 | Tosaya | H01L 23/04 257/704 |
| 2011/0149537 A1 | 6/2011 | Kurosawa | |

FOREIGN PATENT DOCUMENTS

| | | |
|---|---|---|
| CN | 108261389 A | 7/2018 |
| CN | 108520867 A | 9/2018 |

OTHER PUBLICATIONS

Chinese second office action, Chinese Application No. 201910174141.8, dated Sep. 30, 2020 (13 pages).
Notification to Grant Patent Right for Invention, Chinese Application No. 201910174141.8, dated Nov. 30, 2020 (6 pages).

* cited by examiner

STRUCTURE FOR CAPACITOR PROTECTION, PACKAGE STRUCTURE, AND METHOD OF FORMING PACKAGE STRUCTURE

CROSS-REFERENCE TO RELATED APPLICATIONS

The present application is a continuation application of Chinese Patent Application No. 201910174141.8, filed on Mar. 8, 2019, in the National Intellectual Property Administration of China, the entire contents of which are hereby incorporated by reference in their entireties.

TECHNICAL FIELD

The present disclosure relates to the field of semiconductor production, and in particular to a structure for capacitor protection, a package structure, and a method of forming the package structure.

BACKGROUND

A ball grid array (BGA) package is a significant package product for electronics. Components of the BGA package may include a substrate having a chip and a solder ball arranged on a bottom of the substrate. The substrate having the chip may be soldered to connect to a mother board via the solder ball. The BGA package may further include a heat dissipating cover for dissipating heat generated while the BGA package is working to an outer environment.

However, performance of the BGA package in the art is relatively poor.

SUMMARY OF THE DISCLOSURE

According to a first aspect of the present disclosure, a structure for capacitor protection is provided and includes: a substrate; a chip, arranged to cover a part of a surface of the substrate; a metal thermal conducting layer, arranged on a top surface of the chip; a capacitive structure, arranged on another part of the surface of the substrate, wherein the another part of the surface of the substrate is not covered by the chip, and the capacitive structure is independent from the chip; and a cover, comprising a first cover layer and a second cover layer connected to the first cover layer, wherein the first cover layer defines a first opening extending through the first cover layer, the second cover layer is arranged on a bottom of the first cover layer and perpendicular to the first cover layer, the first opening further extends through the second cover layer, the first cover layer is arranged on the capacitive structure, the chip is received in the first opening, and the second cover layer is arranged between the capacitive structure and the chip and is fixed to the substrate.

According to a second aspect of the present disclosure, a package structure is provided and includes: a substrate; a chip, arranged to cover a part of a surface of the substrate; a metal thermal conducting layer, arranged on a top surface of the chip; a capacitive structure, arranged on another part of the surface of the substrate, wherein the another part of the surface of the substrate is not covered by the chip, and the capacitive structure is arranged to be independent from the chip; a cover, comprising a first cover layer and a second cover layer connected to the first cover layer, wherein the first cover layer defines a first opening extending through the first cover layer, the second cover layer is arranged on a bottom of the first cover layer and perpendicular to the first cover layer, the first opening is further defined to extend through the second cover layer, the first cover layer is arranged on the capacitive structure, the chip is received in the first opening, and the second cover layer is arranged between the capacitive structure and the chip and is fixed to the substrate; and a heat dissipating cover and a connection layer, wherein the heat dissipating cover is arranged on the substrate and defines a cavity to receive the chip, the metal thermal conducting layer, the capacitive structure, and the cover; and the connection layer is arranged on an edged region of the surface of the substrate and arranged to fix the heat dissipating cover to the substrate.

According to a third aspect of the present disclosure a method of forming a package structure is provided and includes: providing a substrate, wherein a part of a surface of the substrate is covered by a chip, another part of the surface of the substrate, which is not covered by the chip, is covered by a capacitive structure, and the capacitive structure and the chip may be independent from each other; providing a cover, wherein the cover comprises a first cover layer and a second cover layer connected to the first cover layer, the first cover layer defines a first opening extending through the first cover layer, the second cover layer is arranged at a bottom of the first cover layer and perpendicular to the first cover layer, and the first opening further extends through the second cover layer; arranging the cover on the substrate, wherein the first cover layer is arranged on the capacitive structure, the chip is received in the first opening, and the second cover layer is arranged between the capacitive structure and the chip, and is fixed to the substrate; after arranging the cover on the substrate, forming a metal thermal conducting layer on a top surface of the chip; and after forming the metal thermal conducting layer, performing high-temperature reflow soldering, wherein a temperature set during the high-temperature reflow soldering is greater than a melting point of the metal thermal conducting layer.

DETAILED DESCRIPTION

As stated in the background section of the present disclosure, the package structure in the art exhibits relatively poor performance.

Figure 1:
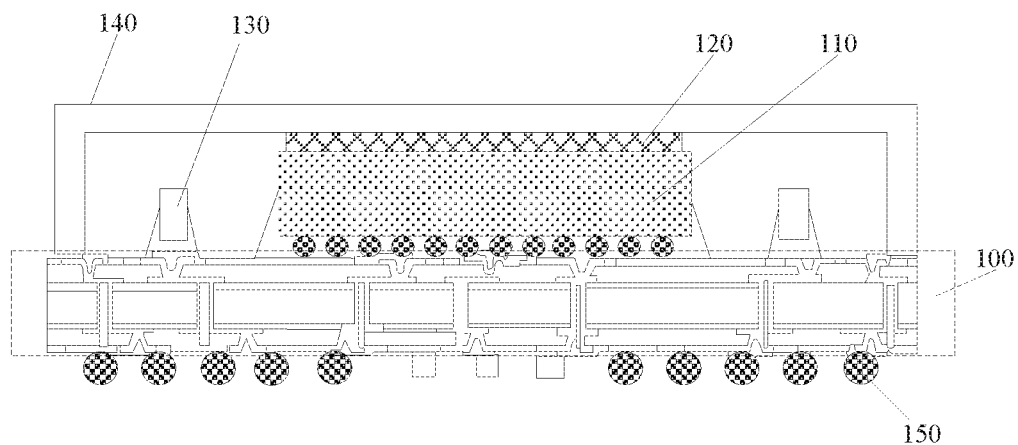
FIG. 1 is a structural view of a package structure in the related art.

As shown in FIG. 1 (Related art), a package structure is provided and may include a substrate 100, a chip 110, a metal thermal conducting layer 120, a capacitive structure 130, a heat dissipating cover 140, and a solder ball 150. The chip 110 may be arranged to cover a part of a surface of the substrate 100. The thermal conducting layer 120 may be arranged on a top surface of the chip 110. A plurality of capacitive structures 130 may be arranged on the surface of the substrate 100, and may be arranged spaced apart from each other. The capacitive structure 130 may be independent from the chip 110. The heat dissipating layer 140 may be arranged on the substrate 100 and may define a cavity to receive the chip 110, the metal thermal conducting layer 120, and the capacitive structure 130. The solder ball 150 may be arranged on a bottom of the substrate 100.

High-temperature reflow soldering may be performed to connect the heat dissipating cover 140 to the metal thermal conducting layer 120. During soldering the heat dissipating cover 140 with the metal thermal conducting layer 120, the metal thermal conducting layer 120 may be splashed. Material of the metal thermal conducting layer 120 may be splashed to a surface of the capacitive structure 130. High-temperature reflow soldering may be performed to connect the solder ball 150 to the bottom of the substrate 100. The solder ball 150 may typically be made of tin, and the metal thermal conducting layer 120 may typically be made of indium. A melting point of tin is greater than a melting point of indium. Therefore, while performing high-temperature reflow soldering to connect the solder ball 150 to the bottom of the substrate 100, the metal thermal conducting layer 120 may not be able to tolerate a temperature of the high-temperature reflow soldering, and therefore, the material of the metal thermal conducting layer 120 may be splashed. The material of the thermal conducting layer 120 may be splashed to the surface of the capacitive structure 130. The material splashed from the thermal conducting layer 120 to the surface of the capacitive structure 130 may cause soldering of the surface of the capacitive structure 130 to form a short circuit, causing failure of the capacitive structure 130.

To reduce a possibility of the material of the thermal conducting layer 120 being splashed to the surface of the capacitive structure 130 directly, a method may be provided, including: before performing high-temperature reflow soldering, arranging an adhesive layer on the surface of the capacitive structure 130. The adhesive layer may be an ultraviolet (UV)-curable adhesive layer. However, during high-temperature reflow soldering, protection of the capacitive structure offered by the adhesive layer may also be invalid. Specifically, during high-temperature reflow soldering, air and flux remained at a bottom of the capacitive structure 130 may be expanded to cause failure protection of the capacitive structure 130 offered by the adhesive layer. The adhesive layer may be deformed and the capacitive structure 130 may be exposed, and the material of the metal thermal conducting layer 120 may still be able to be splashed to the surface of the capacitive structure 130. Even if the adhesive layer is made of high-temperature resistant material, such an issue may still be unable to be solved.

Accordingly, the present disclosure may provide a package structure, including: a substrate, a chip, a thermal conducting layer, a capacitive structure, and a cover. The chip may be arranged to cover a part of a surface of the substrate. The metal thermal conducting layer may be arranged on a top surface of the chip. The capacitive structure may be arranged on another part of the surface of the substrate, and the another part of the surface is not covered by the chip. The capacitive structure may be independent from the chip. The cover may include a first cover layer and a second cover layer connected to the first cover layer. The first cover layer may define a first opening extending through the first cover layer. The second cover layer may be arranged on a bottom of the first cover layer, perpendicular to the first cover layer, and the first opening may further extend through the second cover layer. The first cover layer may be arranged on the capacitive structure. The chip may be received in the first opening. The second cover layer may be arranged between the capacitive structure and the chip, and may be fixed to the substrate. In such a way, the performance of the package structure may be improved.

To clarify the above-mentioned purposes, features, and advantages of the present disclosure, embodiments of the present disclosure may be illustrated in details by referring to the drawings.

As shown in FIGS. 2 to 14, structural views of a process of forming a package structure according to an embodiment of the present disclosure are provided.

Figure 2:
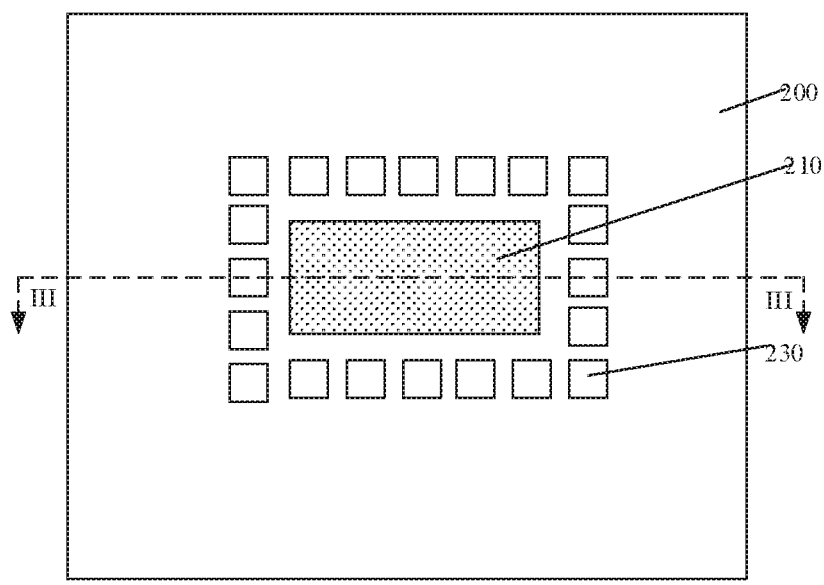
FIG. 2 is a top view of a package structure according to an embodiment of the present disclosure.
Figure 3:
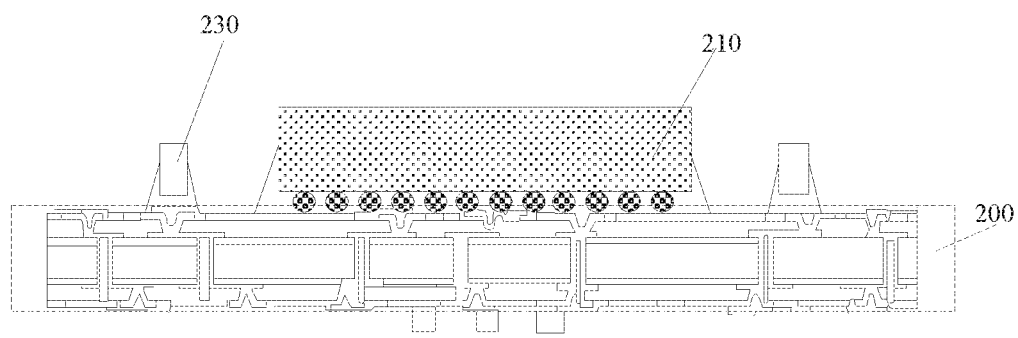
FIG. 3 is a side view of a cross section of the package structure shown in FIG. 2 taking along the line III-III.

As shown in FIG. 2 and FIG. 3, FIG. 2 provides a top view of a package structure, and FIG. 3 provides a cross sectional view of the structure shown in FIG. 2 by taking along the line III-III. A substrate 200 may be provided, and a chip 210 may be arranged to cover a part of a surface of the substrate 200. A capacitive structure 230 may further be arranged on another part of the surface of the substrate 200, and the another part of the surface may not be covered by the chip 210. The capacitive structure 230 may be independent from the chip 210.

The chip 210 and the capacitive structure 230 may be arranged on the surface of a same side of the substrate 200.

A plurality of capacitive structures 230 may be arranged.

Figure 4:
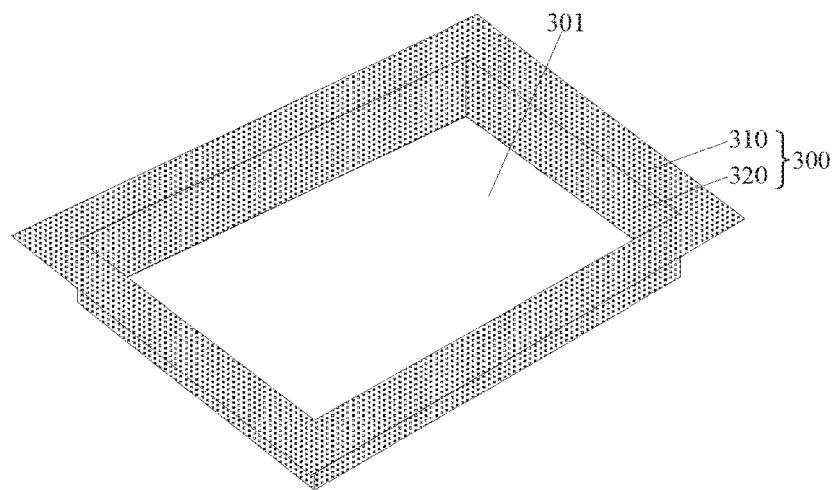
FIG. 4 is a structural view of a cover of a package structure according to an embodiment of the present disclosure.

As shown in FIG. 4, a cover 300 may be arranged. The cover 300 may include a first cover layer 310 and a second cover layer 320 connected to the first cover layer 310. The first cover layer 310 may define a first opening 301 extending through the first cover layer 310. The second cover layer 320 may be arranged on a bottom of the first cover layer 310 and perpendicular to the first cover layer 310. The first opening 301 may be defined to further extend through the second cover layer 320.

In one embodiment, the cover 300 may be made of glass, rubber or resin.

In another embodiment, the cover 300 may be made of metal, and an insulation-isolation layer (not shown in the figure) may be arranged on a surface of the cover 300.

The insulation-isolation layer may be arranged to reduce a possibility of a short circuit formed by a contact between a soldering of a surface of the capacitive structure 230 and the cover 300.

The insulation-isolation layer may be an anodic oxidation film, a coating by chemical vapor deposition, a coating by physical vapor deposition, or an ink layer. Specifically, in an embodiment, the insulation-isolation layer may be made of chromium nitride.

When the cover 300 is made of metal, the anodic oxidation film may be formed by performing anodic oxidation to the surface of the cover 300.

Figure 5:
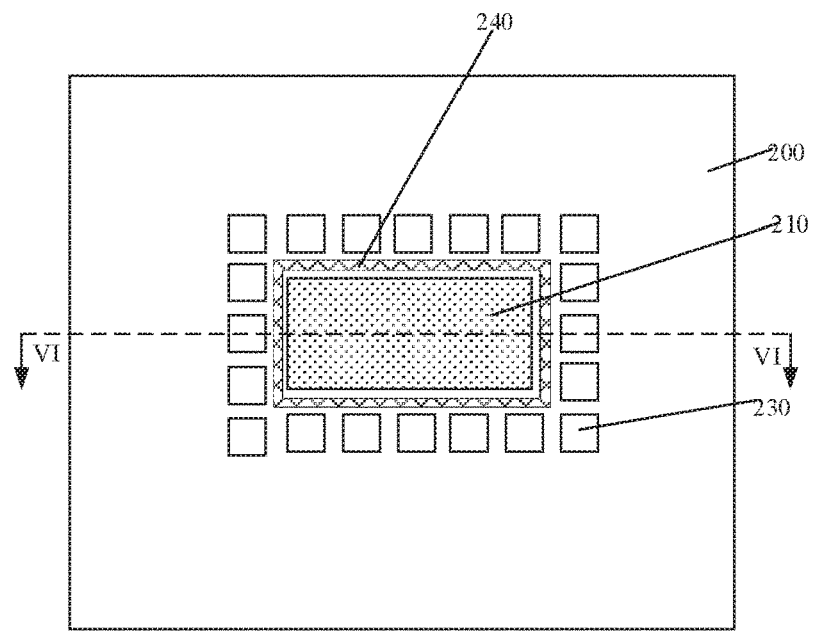
FIG. 5 is a top view of the package structure shown in FIG. 2 with a sealing layer arranged.
Figure 6:
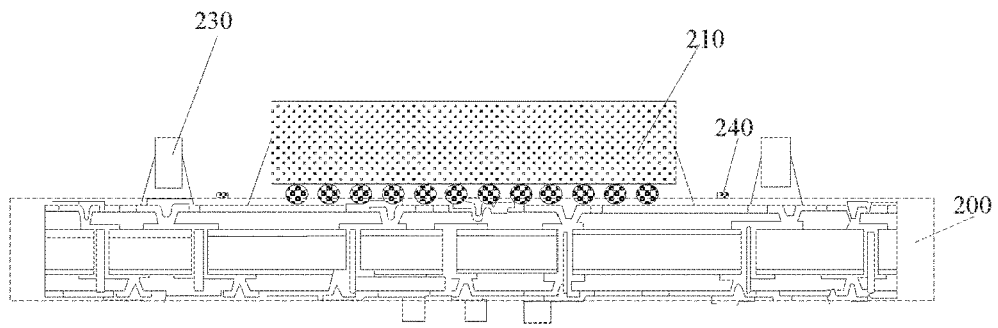
FIG. 6 is a structural view of the package structure shown in FIG. 3 with a sealing layer arranged.

As shown in FIG. 5 and FIG. 6, FIG. 5 provides a top view of the package structure on the basis of the structure shown in FIG. 2, FIG. 6 provides a side view of the package structure on the basis of the structure shown in FIG. 3, and the structure in FIG. 6 is a cross sectional view of the structure shown in FIG. 5 by taking along the line VI-VI. A sealing layer 240 may be formed on the surface of the substrate 200 between the chip 210 and the capacitive structure 230. The sealing layer 240 may be in a shape of a ring. The sealing layer 240 may be independent from the chip 210 and the capacitive structure 230.

The sealing layer 240 may be made of silicone.

Figure 7:
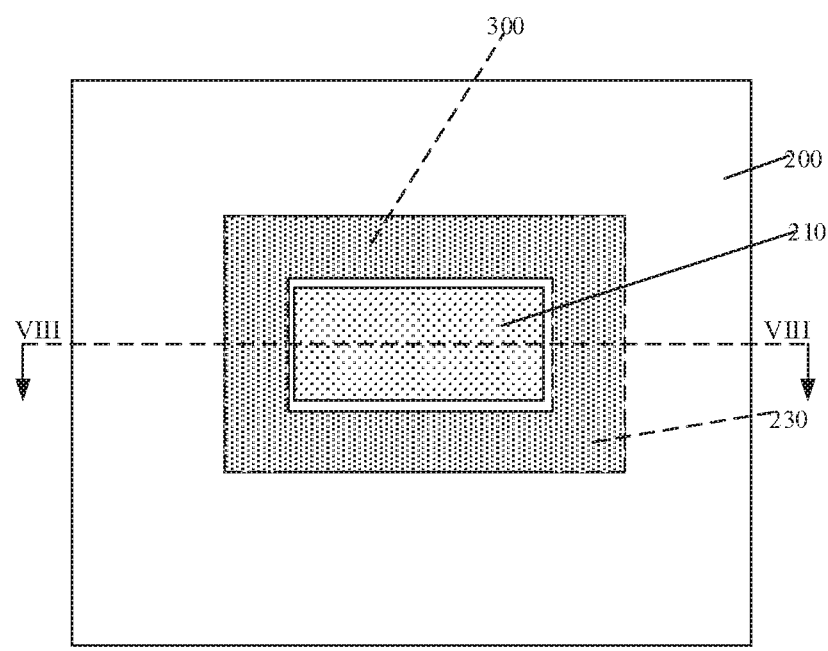
FIG. 7 is a top view of the package structure shown in FIG. 5 with a cover arranged.
Figure 8:
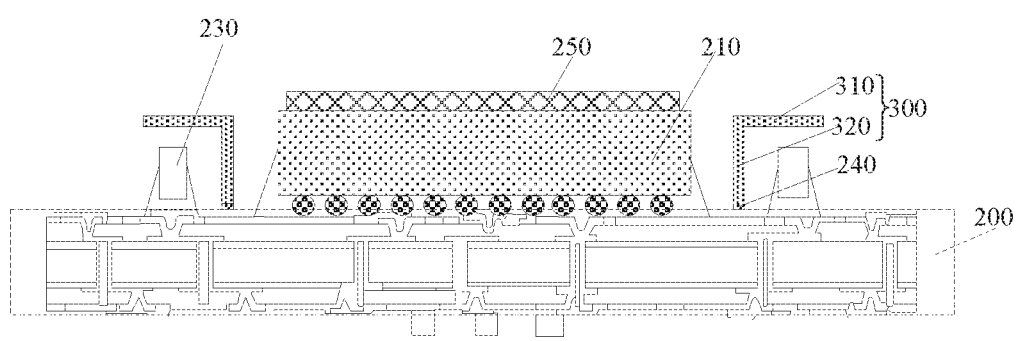
FIG. 8 is a structural view of the package structure shown in FIG. 6 with a cover arranged.

As shown in FIG. 7 and FIG. 8, FIG. 7 provides a top view of the package structure on the basis of the structure shown in FIG. 5, FIG. 8 provides a schematic view of the package structure on the basis of the structure shown in FIG. 6, and the structure in FIG. 8 is a cross sectional view of the structure shown in FIG. 7 by taking along the line VIII-VIII. The cover 300 may be arranged on the substrate 200. The first cover layer 310 may be arranged on the capacitive structure 230, the chip 210 may be received in the first opening 301, and the second cover layer 320 may be arranged between the capacitive structure 230 and the chip 210 and may be arranged to fix to the substrate 200.

Specifically, the second cover layer 320 may be arranged on the sealing layer 240. The sealing layer 240 may be arranged to fix the second cover layer 320 with a part of the surface of the substrate 200, and the part of the surface may be between and uncovered by the capacitive structure 230 and the chip 210.

The second cover layer 320 may be perpendicular to the surface of the substrate 200.

The second cover layer 320 may be arranged to surround the chip 210.

The cover 300 may be independent from the capacitive structure 230 and the chip 210.

Figure 9:
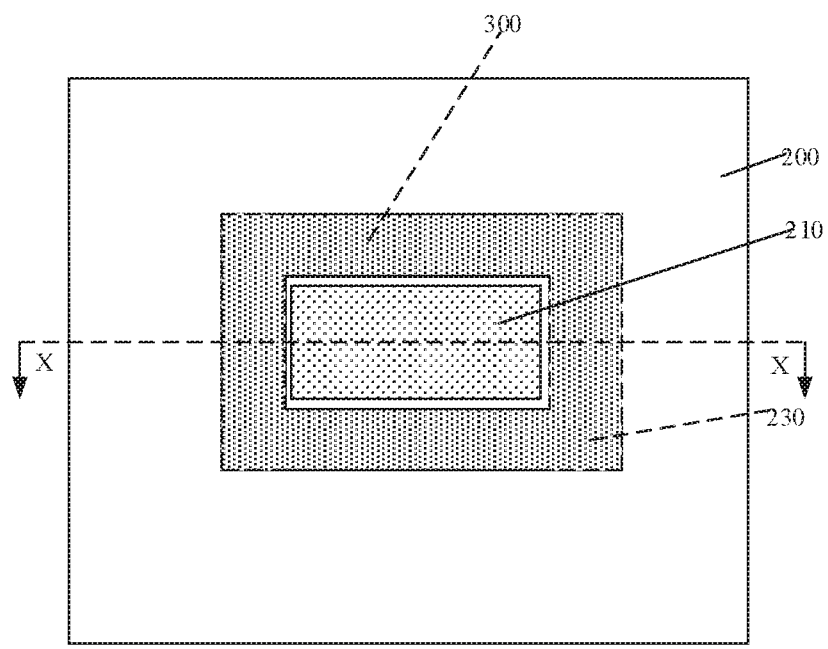
FIG. 9 is a top view of the package structure shown in FIG. 7 with a metal thermal conducting layer arranged.
Figure 10:
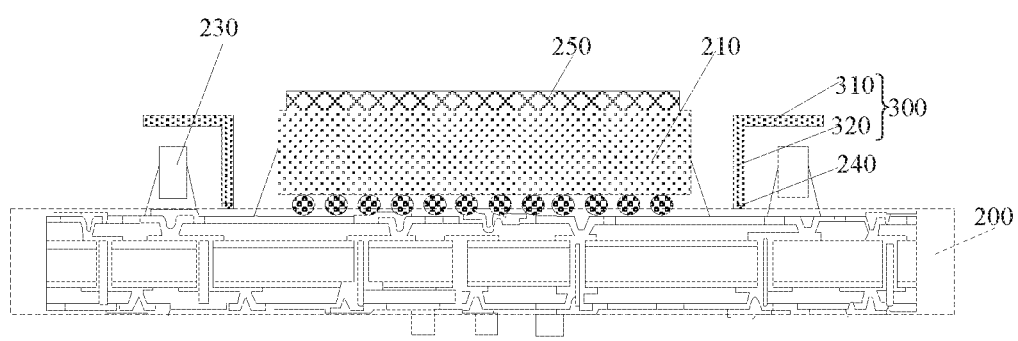
FIG. 10 is a structural view of the package structure shown in FIG. 8 with a metal thermal conducting layer arranged.

As shown in FIG. 9 and FIG. 10, FIG. 9 provides a top view of the package structure on the basis of the structure shown in FIG. 7, FIG. 10 provides a schematic view of the package structure on the basis of the structure shown in FIG. 8, and FIG. 10 is a side view of a cross section of the structure shown in FIG. 9 by taking along the line X-X. After arranging the cover 300 on the substrate 200, a metal thermal conducting layer 250 may be formed on a top surface of the chip 210.

The metal thermal conducting layer 250 may be arranged to conduct thermal to a heat dissipating cover, and the thermal may be generated while the chip 210 is working.

The metal thermal conducting layer 250 may be made of indium, indium alloy, tin alloy, or silver alloy, and the indium, the indium alloy, the tin alloy, or the silver alloy may allow the metal thermal conducting layer 250 to have high thermal conductivity.

The top surface of the chip 210 may be arranged with a first gold coating layer. The metal thermal conducting layer 250 may be arranged on the first gold coating layer, and may contact the first gold coating layer.

Figure 11:
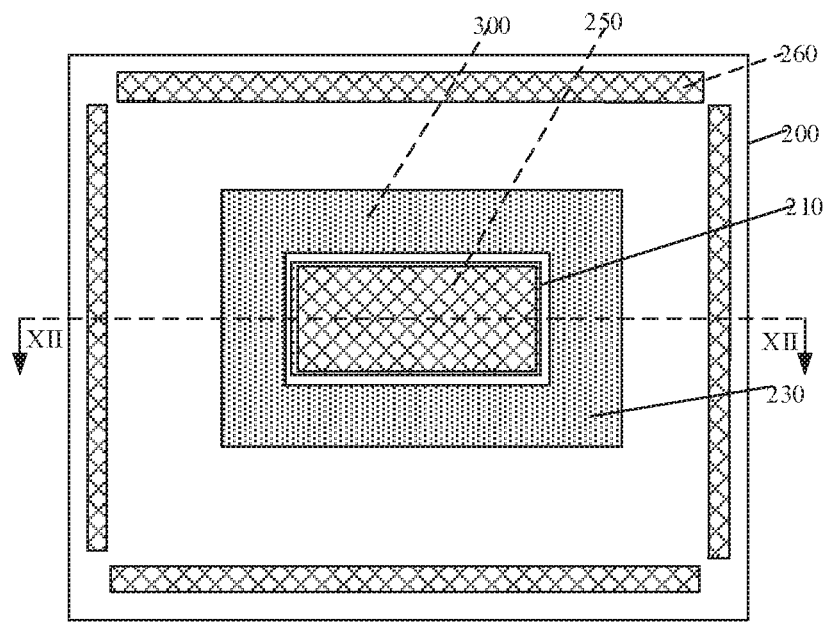
FIG. 11 is a top view of the package structure shown in FIG. 9 with a connection layer arranged.
Figure 12:
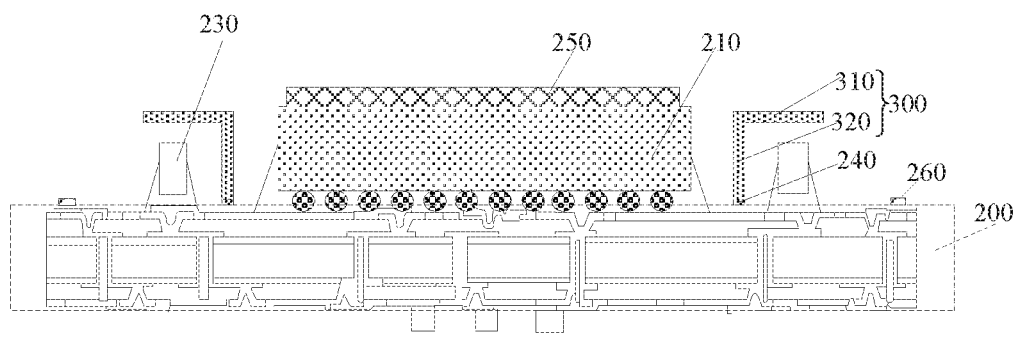
FIG. 12 is a structural view of the package structure shown in FIG. 10 with a connection layer arranged.

As shown in FIG. 11 and FIG. 12, FIG. 11 provides a top view of the package structure on the basis of the structure shown in FIG. 9, FIG. 12 provides a schematic view of the package structure on the basis of the structure shown in FIG. 10, and the structure in FIG. 12 is a cross sectional view of the structure shown in FIG. 11 by taking along the line XII-XII. A connection layer 260 may be formed on a surface of an edged region of the substrate 200.

The connection layer 260 may be arranged to surround the capacitive structure 230 and the chip 210.

The connection layer 260 may include two or more sections disconnected with each other.

Figure 13:
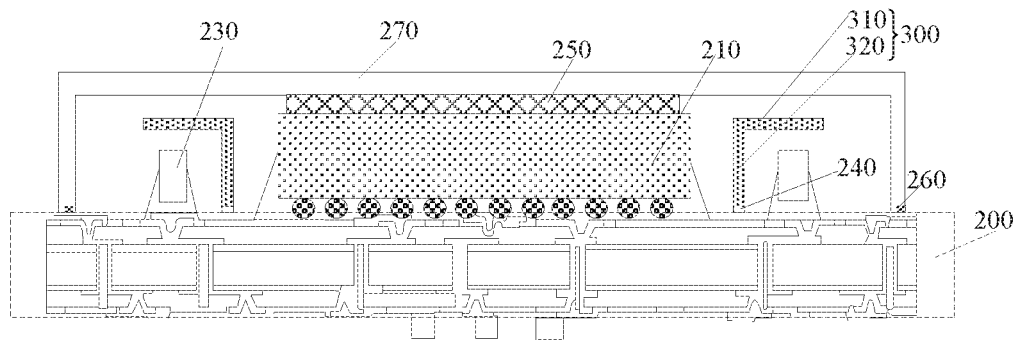
FIG. 13 is a structural view of the package structure shown in FIG. 12 with a heat dissipating cover arranged.

As shown in FIG. 13, a schematic view of the package structure on the basis of the structure shown in FIG. 12 is provided. A heat dissipating cover 270 may be arranged on the substrate 200, and may define a cavity to receive the chip 210, the metal thermal conducting layer 250, the capacitive structure 230, and the cover 300.

The heat dissipating cover 270 may include a side cover and a top cover. The side cover may be connected to the top cover. The side cover may be arranged on the edged region of the substrate 200 and on a side of the chip 210 and the capacitive structure 230. The top cover may be arranged above the side cover, the capacitive structure 230, the chip 210, and the metal thermal conducting layer 250.

The heat dissipating cover 270 may be arranged to spread the heat generated in an inside of the package structure to an outer environment.

The top cover may be arranged to contact the metal thermal conducting layer 250.

The side cover may be arranged on the connection layer 260, and the connection layer 260 may be arranged to fix the side cover to the edge of the substrate 200.

A surface of the heat dissipating cover 270 facing the metal thermal conducting layer may be arranged with a second gold coating layer 250, and the metal thermal conducting layer 250 may be arranged to contact the second gold coating layer. Specifically, a surface of the top cover facing the metal thermal conducting layer may be arranged with the second gold coating layer.

The heat dissipating cover 270 and the edge of the substrate 200 may not be completely sealed, and a plurality of small openings 271 (i.e., a plurality of air vents of the package structure) may be defined at some regions. In such a way, remaining flux in the metal thermal conducting layer 250 may be evaporated during high-temperature reflow soldering and may be able to flow to the outer environment through the plurality of small openings.

Figure 14:
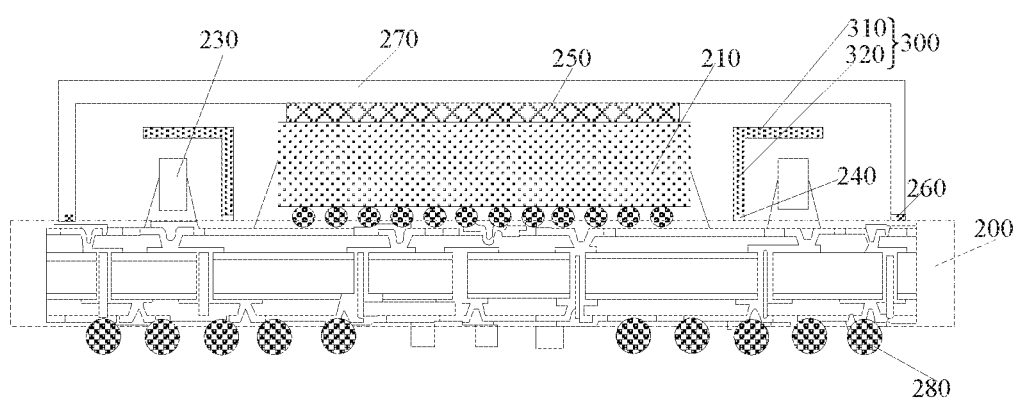
FIG. 14 is a structural view of a package structure according to an embodiment of the present disclosure.
Figure 15:
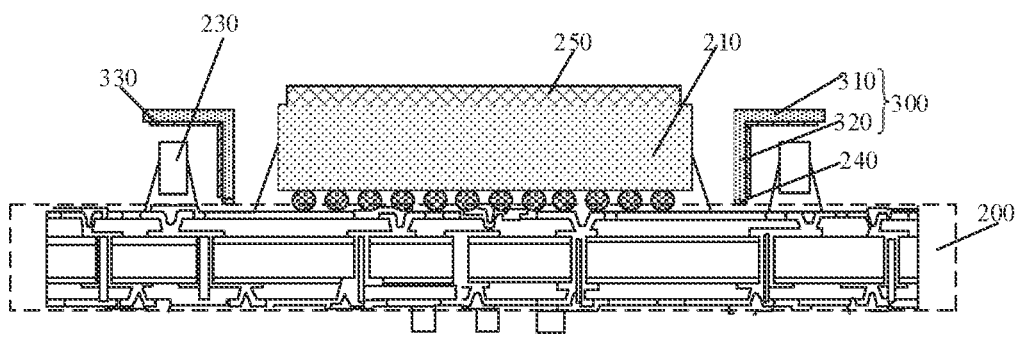
FIG. 15 is a structural view of the package structure shown in FIG. 6 with an insulation-isolation layer arranged.
Figure 16:
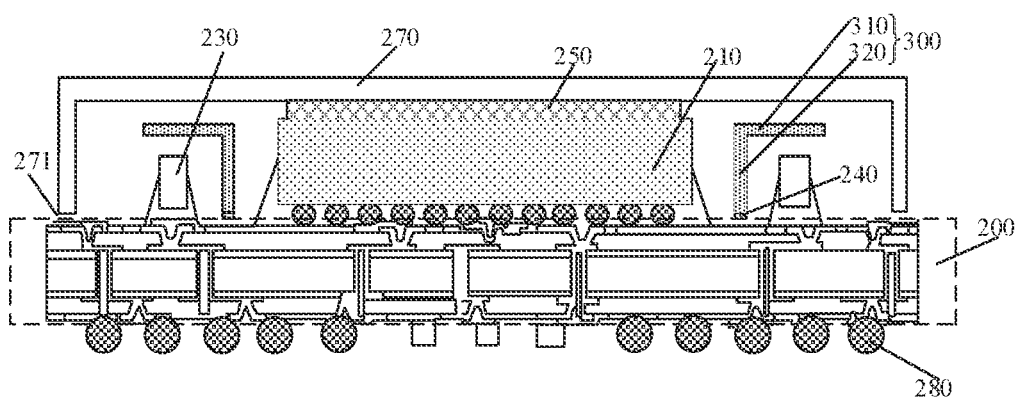
FIG. 16 is a structural view of a package structure according to another embodiment of the present disclosure.

As shown in FIG. 14, after arranging the heat dissipating cover 270 on the substrate 200, a first high-temperature reflow soldering may be performed to solder the heat dissipating cover 270, the chip 210, and the metal thermal conducting layer 250 together. After the first high-temperature reflow soldering, a second high-temperature reflow soldering may be performed to solder a ball 280 to the bottom of the substrate 200.

A temperature of the first high-temperature reflow soldering may be greater than a melting point of the metal thermal conducting layer 250, and a temperature of the second high-temperature reflow soldering may be greater than the temperature of the first high-temperature reflow soldering.

A soldering ball 280 may be made of tin, tin-silver alloy, tin-silver-copper alloy, tin-lead alloy, or gold-contained alloy.

The tin, tin-silver alloy, and tin-silver-copper alloy may be environment protective and reliable. The tin-lead alloy may be highly invasive and require a lower temperature for reflow soldering.

After the first high-temperature reflow soldering, a distance between a top surface of the first cover layer 310 and the top cover may be smaller than a distance between a top surface of the metal thermal conducting layer 250 and the top cover.

The present embodiment may further provide a package structure formed by performing the above-mentioned method. As shown in FIG. 14, the package structure may include: a substrate 200; a chip 210 arranged to cover a part of a surface of the substrate 200; a metal thermal conducting layer 250 arranged on a top surface of the chip 210; a capacitive structure 230 arranged on another part of the surface of the substrate 200, wherein the another part of the surface of the substrate 200 is not covered by the chip 210, and the capacitive structure 230 may be independent from the chip 210; a cover 300, including a first cover layer 310 and a second cover layer 320 connected to the first cover layer 310. The first cover layer 310 may define a first opening 301 extending through the first cover layer 310. The second cover layer 320 may be arranged on the bottom of the first cover layer 310 and perpendicular to the first cover layer 310. The first opening 301 may further extend through the second cover layer 320. The first cover layer 310 may be arranged on the capacitive structure 230. The chip 210 may be received in the first opening 301. The second cover layer 320 may be arranged between the capacitive structure 230 and the chip 210, and may be fixed to the substrate 200.

In one embodiment, the cover 300 may be made of glass, rubber, plastics, or resin.

In another embodiment, the cover 300 may be made of metal, such as steel, a surface of the cover 300 may be arranged with an insulation-isolation layer 330.

The insulation-isolation layer may be an anodic oxidation film, a coating by chemical vapor deposition, a coating by physical vapor deposition, or an ink layer. Specifically, in one embodiment, the insulation-isolation layer may be a layer of chromium nitride.

A projection of the chip 210 onto the surface of the substrate 200 may be rectangular or squared. The projection of the chip 210 onto the surface of the substrate 200 may include a first chip edge and a second chip edge, and the first chip edge is perpendicular to the second chip edge.

A projection of the first cover layer 310 onto the surface of the substrate 200 may be a rectangular ring or a squared ring. The projection of the first cover layer 310 onto the surface of the substrate 200 may include an inner ring and an outer ring. The outer ring may encircle the inner ring. The inner ring may include a first inner edge of the cover and a second inner edge of the cover, and the first inner edge may be perpendicular to the second inner edge. The outer ring may include a first outer edge of the cover and a second outer edge of the cover, and the first outer edge may be perpendicular to the second outer edge.

A projection of the capacitive structure 230 onto the surface of the substrate 200 may be rectangular or squared. The projection of the capacitive structure 230 onto the surface of the substrate 200 may include a first capacitive structure edge and a second capacitive structure edge.

The first capacitive structure edge, the first outer edge of the cover, the first inner edge of the cover, and the first chip edge may be parallel with each other. The second capacitive structure edge, the second outer edge of the cover, the second inner edge of the cover, and the second chip edge may be parallel with each other.

A length of the first inner edge of the cover may be equal to a sum of a length of the first chip edge and 2 times of a first position error. A length of the second inner edge of the cover may be equal to a sum of a length of the second chip edge and 2 times of a second position error. A length of the first outer edge of the cover may be equal to a sum of the length of the first chip edge, a length of the first capacitive structure edge, and 2 times of the first maximum position error. The length of the first capacitive structure edge may be equal to a sum the length of the second chip edge, the length of the second capacitive structure edge, and 2 times of the second position error.

The second position error may be 0.03 mm to 0.05 mm.

When the projection of the chip 210 onto the surface of the substrate 200 is rectangular, the projection of the first cover layer 310 onto the surface of the substrate 200 may be the rectangular ring. When the projection of the chip 210 onto the surface of the substrate 200 is squared, the projection of the first cover layer 310 onto the surface of the substrate 200 may be the squared ring.

To be noted that, in other embodiments, the projection of the chip 210 onto the surface of the substrate 200 may be elliptical, and the projection of the first cover layer 310 onto the surface of the substrate 200 may be an elliptical ring. In other embodiments, the projection of the chip 210 onto the surface of the substrate 200 may be circular, and the projection of the first cover layer 310 onto the surface of the substrate 200 may be a circular ring.

A distance between the first cover layer 310 and the top surface of the capacitive structure 230 may be greater than a third position error, and the third position error may be 0.05 mm to 0.1 mm. The distance between the first cover layer 310 and the top surface of the capacitive structure 230 may refer to a distance between the top surface of the first cover layer 310 and the top surface of the capacitive structure 230.

A distance between the top surface of the first cover layer 310 and the top cover of the heat dissipating cover may be greater than a distance between the top surface of the metal thermal conducting layer 250 and the top cover of the heat dissipating cover.

The package structure may further include a sealing layer 240 arranged between a bottom of the second cover layer 320 and the substrate 200.

A width of the sealing layer 240 may be smaller than the first position error.

The first position error may be 0.03 mm to 0.05 mm.

The metal thermal conducting layer 250 may be made of indium, indium alloy, tin alloy, or silver alloy.

The package structure may further include: a first gold coating layer between the metal thermal conducting layer 250 and the chip 210; a heating dissipating cover 270 arranged on the substrate 200, wherein the heating dissipating cover 270 may define a cavity to receive the chip 210, the metal conducting layer 250, the capacitive structure 230, and the cover 300; a second gold coating layer arranged on the surface of the heat dissipating cover 270 facing the metal conducting layer, wherein the metal thermal conducting layer may be arranged to contact the second gold coating layer; and a soldering ball 280 arranged on the bottom of the substrate.

In the present embodiment, the package structure may be a ball grid array structure.

To be noted that, when the metal thermal conducting layer 250 is made of material other than indium, such as electrical conductive material or material able to be splashed easily, the cover 300 of the present disclosure may also be adapted to protect the capacitive structure.

When the metal thermal conducting layer 250 is made of material flowable under a high temperature, the metal thermal conducting layer 250 may be flowable during high-temperature reflow soldering, and the material of the metal thermal conducting layer 250 may be able to flow to a groove between the second cover layer 320 and the chip 210. The cover may be able to isolate the material of the metal thermal conducting layer 250 reaching the groove between the second cover layer 320 and the chip 210 from the capacitive structure 230.

To be noted that, when a soldering point on a surface of the capacitive structure is arranged to contact the cover, the soldering point on the surface of the capacitive structure may be able to flow along the surface of the cover during high-temperature reflow soldering, such that a plurality of soldering points on the surface of the capacitive structure may be connected with each other. In the present embodiment, the first cover layer 310 and the capacitive structure 230 may not contact with each other, and the second cover layer 320 and the capacitive structure 230 may not contact with each other, such that the plurality of soldering points on the surface of the capacitive structure 230 may be spaced apart from each other and may not be connected with each other during high-temperature reflow soldering.

Although the present application is disclosed in the above, the present application is not limited by the specification. Any one of skill in the art may perform any alternation and modification without departing from the spirit and scope of the present disclosure, and therefore, the present disclosure should be defined by the scope of the claims.

What is claimed is:

1. A structure for capacitor protection, comprising:
   a substrate;
   a chip, arranged to cover a part of a surface of the substrate;
   a metal thermal conducting layer, arranged on a top surface of the chip;
   a capacitive structure, arranged on another part of the surface of the substrate, wherein the another part of the surface of the substrate is not covered by the chip, and the capacitive structure is arranged to be independent from the chip; and
   a cover, comprising a first cover layer and a second cover layer connected to the first cover layer, wherein the first cover layer defines a first opening extending through the first cover layer, the second cover layer is arranged on a bottom of the first cover layer and perpendicular to the first cover layer, the first opening is further defined to extend through the second cover layer, the first cover layer is arranged on the capacitive structure, the chip is received in the first opening, and the second cover layer is arranged between the capacitive structure and the chip and is fixed to the substrate; and
   a heat dissipating cover and a connection layer, wherein the heat dissipating cover is arranged on the substrate, the heat dissipating cover comprises a side cover and a top cover connected to the side cover, and the side cover and the top cover cooperatively define a cavity to receive the chip, the metal thermal conducting layer, the capacitive structure, and the cover; and the connection layer is arranged on an edged region of the surface of the substrate and arranged to fix the heat dissipating cover to the substrate,
   wherein an orthographic projection of the first cover layer onto the surface of the substrate completely covers an orthographic projection of the capacitive structure onto the surface of the substrate.

2. The structure for capacitor protection according to claim 1, wherein the cover is made of glass, rubber, plastics, or resin.

3. The structure for capacitor protection according to claim 1, wherein the cover is made of metal, and a surface of the cover is arranged with an insulation-isolation layer.

4. The structure for capacitor protection according to claim 1, wherein
   a projection of the chip onto the surface of the substrate is rectangular or squared, the projection of the chip onto the surface of the substrate has a first chip edge and a second chip edge, and the first chip edge is perpendicular to the second chip edge;
   a projection of the first cover layer onto the surface of the substrate is a rectangular ring or a squared ring, the projection of the first cover layer onto the surface of the substrate has an inner ring and an outer ring, the inner ring has a first inner edge of the cover and a second inner edge of the cover, the first inner edge is perpendicular to the second inner edge, the outer ring has a first outer edge of the cover and a second outer edge of the cover, and the first outer edge is perpendicular to the second outer edge;
   a projection of the capacitive structure onto the surface of the substrate is rectangular or squared, the capacitive structure onto the surface of the substrate has a first capacitive structure edge and a second capacitive structure edge;
   the first capacitive structure edge, the first outer edge of the cover, the first inner edge of the cover, and the first chip edge are parallel with each other, and the second capacitive structure edge, the second outer edge of the cover, the second inner edge of the cover, and the second chip edge are parallel with each other;
   a length of the first inner edge of the cover is equal to a sum of a length of the first chip edge and 2 times of a first position error, a length of the second inner edge of the cover is equal to a sum of a length of the second chip edge and 2 times of a second position error, a length of the first outer edge of the cover is equal to a sum of the length of the first chip edge, the length of the first capacitive structure edge, and 2 times of the first position error, and the length of the first capacitive edge is equal to a sum of the length of the second chip edge, the length of the second capacitive structure edge, and 2 times of the second position error, and
   the first position error is 0.03 mm to 0.05 mm, and the second position error is 0.03 mm to 0.05 mm.

5. The structure for capacitor protection according to claim 1, wherein a distance between the first cover layer and a top surface of the capacitive structure is greater than a third position error, and the third position error is 0.05 mm to 0.1 mm.

6. The structure for capacitor protection according to claim 1, wherein a distance between a top surface of the first cover layer and the substrate is smaller than a distance between a top surface of the metal thermal conducting layer and the substrate.

7. The structure for capacitor protection according to claim 1, further comprising a sealing layer, arranged between a bottom of the second cover layer and the substrate.

8. The structure for capacitor protection according to claim 7, wherein a width of the sealing layer is smaller than a first position error, and the first position error is 0.03 mm to 0.05 mm.

9. A package structure, comprising:
   a substrate;
   a chip, arranged to cover a part of a surface of the substrate;

a metal thermal conducting layer, arranged on a top surface of the chip;
a capacitive structure, arranged on another part of the surface of the substrate, wherein the another part of the surface of the substrate is not covered by the chip, and the capacitive structure is arranged to be independent from the chip;
a cover, comprising a first cover layer and a second cover layer connected to the first cover layer, wherein the first cover layer defines a first opening extending through the first cover layer, the second cover layer is arranged on a bottom of the first cover layer and perpendicular to the first cover layer, the first opening is further defined to extend through the second cover layer, the first cover layer is arranged on the capacitive structure, the chip is received in the first opening, and the second cover layer is arranged between the capacitive structure and the chip and is fixed to the substrate; and
a heat dissipating cover and a connection layer, wherein the heat dissipating cover is arranged on the substrate, the heat dissipating cover comprises a side cover and a top cover connected to the side cover, and the side cover and the top cover cooperatively define a cavity to receive the chip, the metal thermal conducting layer, the capacitive structure, and the cover; and the connection layer is arranged on an edged region of the surface of the substrate and arranged to fix the heat dissipating cover to the substrate.

10. The package structure according to claim 9, wherein the cover is made of glass, rubber, plastics, or resin.

11. The package structure according to claim 9, wherein the cover is made of metal, and a surface of the cover is arranged with an insulation-isolation layer.

12. The package structure according to claim 9, wherein
a projection of the chip onto the surface of the substrate is rectangular or squared, the projection of the chip onto the surface of the substrate has a first chip edge and a second chip edge, and the first chip edge is perpendicular to the second chip edge;
a projection of the first cover layer onto the surface of the substrate is a rectangular ring or a squared ring, the projection of the first cover layer onto the surface of the substrate has an inner ring and an outer ring, the inner ring has a first inner edge of the cover and a second inner edge of the cover, the first inner edge is perpendicular to the second inner edge, the outer ring has a first outer edge of the cover and a second outer edge of the cover, and the first outer edge is perpendicular to the second outer edge;
a projection of the capacitive structure onto the surface of the substrate is rectangular or squared, the capacitive structure onto the surface of the substrate has a first capacitive structure edge and a second capacitive structure edge; and
the first capacitive structure edge, the first outer edge of the cover, the first inner edge of the cover, and the first chip edge are parallel with each other, and the second capacitive structure edge, the second outer edge of the cover, the second inner edge of the cover, and the second chip edge are parallel with each other.

13. The package structure according to claim 12, wherein
a length of the first inner edge of the cover is equal to a sum of a length of the first chip edge and 2 times of a first position error, a length of the second inner edge of the cover is equal to a sum of a length of the second chip edge and 2 times of a second position error, a length of the first outer edge of the cover is equal to a sum of the length of the first chip edge, the length of the first capacitive structure edge, and 2 times of the first position error, and the length of the first capacitive edge is equal to a sum of the length of the second chip edge, the length of the second capacitive structure edge, and 2 times of the second position error; and
the first position error is 0.03 mm to 0.05 mm, and the second position error is 0.03 mm to 0.05 mm.

14. The package structure according to claim 9, wherein a distance between the first cover layer and a top surface of the capacitive structure is greater than a third position error, and the third position error is 0.05 mm to 0.1 mm.

15. The package structure according to claim 9, wherein
a distance between a top surface of the first cover layer and a top inner surface of the heat dissipating cover is greater than a distance between a top surface of the metal thermal conducting layer and the a top inner surface of the heat dissipating cover.

16. The package structure according to claim 9, further comprising a sealing layer, arranged between a bottom of the second cover layer and the substrate.

17. The package structure according to claim 16, wherein a width of the sealing layer is smaller than a first position error, and the first position error is 0.03 mm to 0.05 mm.

18. The package structure according to claim 9, wherein
a top inner surface of the dissipating cover is arranged to contact the metal thermal conducting layer allowing heat generated in an inside of the package structure to be spread to an outside; and
a plurality of air vents are defined between the heat dissipating cover and the substrate.

19. A method of forming a package structure, comprising:
providing a substrate, Wherein a part of a surface of the substrate is covered by a chip, another part of the surface of the substrate, which is not covered by the chip, is covered by a capacitive structure, and the capacitive structure and the chip are independent from each other;
providing a cover, wherein the cover comprises a first cover layer and a second cover layer connected to the first cover layer, the first cover layer defines a first opening extending through the first cover layer, the second cover layer is arranged at a bottom of the first cover layer and perpendicular to the first cover layer, and the first opening further extends through the second cover;
arranging the cover on the substrate, wherein the first cover layer is arranged on the capacitive structure, the chip is received in the first opening, and the second cover layer is arranged between the capacitive structure and the chip, and is fixed to the substrate;
after arranging the cover on the substrate, forming a metal thermal conducting layer on a top surface of the chip; and
after forming the metal thermal conducting layer, performing high-temperature reflow soldering, wherein a temperature set during the high-temperature reflow soldering is greater than a melting point of the metal thermal conducting layer,
wherein the method further comprises:
arranging a heat dissipating cover and a connection layer, wherein the heat dissipating cover is arranged on the substrate, the heat dissipating cover comprises a side cover and a top cover connected to the side cover, and the side cover and the top cover cooperatively define a cavity to receive the chip, the metal thermal conducting layer, the capacitive structure, and the cover; and the connection layer is arranged on an edged region of the surface of the substrate and arranged to fix the heat dissipating cover to the substrate.

20. The method of forming a package structure according to claim 19, wherein the performing the high-temperature reflow soldering comprises performing a first high-temperature reflow soldering and performing a second high-temperature reflow soldering; and after arranging the heat dissipating cover on the substrate, t method further comprises:

performing the first high-temperature reflow soldering to solder the heat dissipating cover, the chip, and the metal thermal conducting layer together; and after the performing the first high-temperature reflow soldering, performing the second high-temperature reflow soldering to solder a soldering ball to a bottom of the substrate.

\* \* \* \* \*